US009923522B2

(12) United States Patent
Nakai

(10) Patent No.: US 9,923,522 B2
(45) Date of Patent: Mar. 20, 2018

(54) OPERATIONAL AMPLIFIER CIRCUIT AND BIAS CURRENT SUPPLY METHOD

(71) Applicant: MITSUBISHI ELECTRIC CORPORATION, Chiyoda-ku, Tokyo (JP)

(72) Inventor: Takayuki Nakai, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/305,462

(22) PCT Filed: Jul. 8, 2014

(86) PCT No.: PCT/JP2014/068146
§ 371 (c)(1),
(2) Date: Oct. 20, 2016

(87) PCT Pub. No.: WO2016/006032
PCT Pub. Date: Jan. 14, 2016

(65) Prior Publication Data
US 2017/0040949 A1 Feb. 9, 2017

(51) Int. Cl.
*H03F 3/45* (2006.01)
*H03F 1/02* (2006.01)

(52) U.S. Cl.
CPC ......... *H03F 1/0233* (2013.01); *H03F 1/0277* (2013.01); *H03F 3/45219* (2013.01);
(Continued)

(58) Field of Classification Search
CPC .................................... H03F 3/45; H03F 3/68
(Continued)

(56) References Cited

U.S. PATENT DOCUMENTS

| 5,561,396 A | 10/1996 | Hogervorst et al. |
| 5,734,297 A | 3/1998 | Huijsing et al. |

(Continued)

FOREIGN PATENT DOCUMENTS

| JP | 9-093052 A | 4/1997 |
| JP | H10-502788 A | 3/1998 |

(Continued)

OTHER PUBLICATIONS

Office Action dated Jul. 11, 2017, by the Japanese Patent Office in corresponding Japanese Patent Application No. 2016-532813, and an English Translation of the Office Action. (5 pages).

(Continued)

*Primary Examiner* — Steven J Mottola
(74) *Attorney, Agent, or Firm* — Buchanan Ingersoll & Rooney PC

(57) ABSTRACT

Bias current is supplied to a first differential pair and a second differential pair from a first transistor being a single current source. Bias current is supplied to a third differential pair and a fourth differential pair from a second transistor being a single current source. An input voltage is at a power supply potential, and an input voltage is at a ground potential. When the second differential pair and the third differential pair are turned OFF, the bias current supplied from the first transistor flows to an output stage via the first differential pair, and the bias current supplied from the second transistor flows to the output stage via the fourth differential pair. Therefore, when the second differential pair and the third differential pair are turned OFF, a circuit current is kept constant, and a fluctuation in a frequency characteristic can be restrained.

16 Claims, 15 Drawing Sheets

(52) U.S. Cl.
CPC ..... *H03F 3/45475* (2013.01); *H03F 3/45748* (2013.01); *H03F 2200/261* (2013.01)

(58) Field of Classification Search
USPC .................................................. 330/253, 261
See application file for complete search history.

(56) References Cited

U.S. PATENT DOCUMENTS

| | | | |
|---|---|---|---|
| 5,929,705 | A | 7/1999 | Zhang et al. |
| 6,359,510 | B1 | 3/2002 | Ishii et al. |
| 2002/0089377 | A1 | 7/2002 | Hwang |
| 2006/0091955 | A1* | 5/2006 | Choi .......................... H03F 1/08 330/260 |
| 2011/0169567 | A1* | 7/2011 | Lin ...................... H03F 3/45183 330/253 |
| 2014/0139267 | A1 | 5/2014 | Wang et al. |

FOREIGN PATENT DOCUMENTS

| | | |
|---|---|---|
| JP | 11-027064 A | 1/1999 |
| JP | 2001-085958 A | 3/2001 |
| JP | 2002-185272 A | 6/2002 |
| JP | 2009-033230 A | 2/2009 |
| JP | 2014-078804 A | 5/2014 |

OTHER PUBLICATIONS

International Search Report (PCT/ISA/210) dated Aug. 12, 2014, by the Japanese Patent Office as the International Searching Authority for International Application No. PCT/JP2014/068146.
Written Opinion (PCT/ISA/237) dated Aug. 12, 2014, by the Japanese Patent Office as the International Searching Authority for International Application No. PCT/JP2014/068146.
Transistor Technology, CQ Press, Apr. 2011, vol. 48, No. 4, 559$^{th}$; pp. 89-91.
Paul Gray et al., "Analysis and Design of Analog Integrated Circuits", Fourth Edition, Wiley, pp. 847-849.
Extended European Search Report dated Jan. 22, 2018 in corresponding to European Patent Application No. 14897045.2.
M. A. Ibrahim, H. Kuntman, and O. Cicekoglu, "A very high-frequency CMOS self-biasing complementary folded cascode differential difference current conveyor with application examples," The 2002 45th Midwest Symposium on Circuits and Systems, 2002. MWSCAS-2002., 2002, pp. I-279-82 vol. 1.

* cited by examiner

OPERATIONAL AMPLIFIER CIRCUIT AND BIAS CURRENT SUPPLY METHOD

TECHNICAL FIELD

The present invention relates to an operational amplifier circuit and particularly relates to a technology of the operational amplifier circuit including a plurality of differential pairs.

BACKGROUND ART

Conventionally, in order to amplify analog voltage precisely, an amplifier circuit using an operational amplifier has been used. However, due to a decrease in power supply voltage accompanying with recent miniaturization of a CMOS process, a problem has emerged that voltage amplitude is reduced and S/N (Signal-to-Noise ratio) is deteriorated.

As a countermeasure, a so-called fully differential amplifier circuit has come in use. In the fully differential amplifier circuit, differentiating a signal improves the S/N by obtaining signal amplitude being up to twice as large as the power supply voltage. Further, output impedance of a sensor device that takes information of nature such as light, acceleration, and sound as an analog signal into the circuit is generally high (more than several MΩ). Thus, in order to connect to such a sensor device, it is necessary to connect a non-inverting amplifier circuit that can obtain high input impedance which is more than several GΩ.

FIG. 15 illustrates a conventional circuit of a single end operational amplifier. As the non-inverting amplifier circuit, a configuration of an instrumentation amplifier (an instrumentation amplifier, Non-Patent Literature 1) of FIG. 14 configured using two single end operational amplifiers of FIG. 15 and configurations illustrated in FIGS. 10 and 11 as a symbol of the operational amplifier are exemplified.

Here, an operation of a conventional differential amplifier circuit (e.g., FIG. 14) will be concisely described. Hereinafter, regarding equations (1) to (22), for example, in the case of equations (1) to (4) corresponding to FIG. 14, although electric potentials of an inverting input terminal and an inverting input terminal are expressed as the same description as VINP, it is clear that these are different and the distinction will not be particularly explained. Hereinafter, a differential input voltage is expressed as:

$$VIN = VINP - VINM \quad (1)$$

A differential output voltage with respect to VIN is expressed as:

$$VOUT = G \cdot VIN = VOUTP - VOUTM \quad (2)$$

Where G is a voltage gain of the amplifier circuit. Note that, for simplicity, the gain of the operation amplifier is assumed to be infinity.

Firstly, the instrumentation amplifier will be described. The instrumentation amplifier includes, as in FIG. 14, two single end operational amplifiers illustrated in FIG. 15 and a resistor network configured with resistors R100, R200, and R201.

If $$R200 = R201 \quad (3)$$

the gain G is expressed as:

$$G = (R100 + 2 \cdot R200)/R100 \quad (4)$$

Hence, the differential output voltage can be obtained from the equation (2).

Further, a configuration using a double differential operational amplifier shows the same operation.

FIGS. 10 and 11 illustrate a symbol of the double differential operational amplifier.

For FIG. 10, $$G = 1 \quad (5)$$

and for FIG. 11, if $$R100 = R101 \quad (6)$$

$$R200 = R201 \quad (7)$$

G is expressed as:

$$G = (R100 + R200)/R100 \quad (8)$$

According to a configuration of the instrumentation amplifier illustrated in FIG. 10, in a non-inverting amplifier circuit, a signal is input to an input terminal of the operational amplifier, and thereby voltage does not remain constant, in contrast to an inverting amplifier circuit in which an input terminal of the operational amplifier is virtually grounded, and thereby voltage remains constant. In particular, when the non-inverting amplifier circuit is connected to a sensor device, a problem arises that its signal amplitude may possibly spread over a wide range. When the signal amplitude spreads over the wide range, as described below, a differential pair may possibly turn off.

To solve the problem, in a circuit of a double differential operational amplifier of FIG. 13, PMOS differential pairs D30 and D40 are respectively connected to two NMOS differential pairs D10 and D20 in parallel. According to this configuration, for the input voltage of the wide range within a range from ground potential to power supply potential, at least either one of NMOS differential pairs or PMOS differential pairs is operated. Therefore, according to this configuration (rail-to-rail), a differential amplification operation is enabled within all of the range from the ground potential to the power supply potential.

Similarly with respect to the single end operational amplifier of FIG. 15, the PMOS differential pair D30 is connected to the NMOS differential pair D10 in parallel. This configuration is also the rail-to-rail configuration, and an amplification operation of a differential signal is enabled within all of the range from the ground potential to the power supply potential.

On the one hand, in a configuration mentioned above in which an NMOS differential pair and a PMOS differential pair are connected in parallel, if mutual conductance of the NMOS differential pair is gmn, and mutual conductance of the PMOS differential pair is gmp, the actual mutual conductance obtained by adding both of the mutual conductances, gmdiff can be expressed as:

$$gm\text{diff} = gmn + gmp \quad (9)$$

However, for example, when voltage close to the ground potential is input, the NMOS differential pair is turned OFF and becomes unable to operate. Hence, gmn 0, and gmdiff is reduced to as follows:

$$gm\text{diff} \approx gmp \quad (10)$$

On the other hand, according to similar consideration, when voltage close to the power supply potential is input, the PMOS differential pair is turned OFF and becomes unable to operate. Hence, gmp≈0, and gmdiff goes as follows:

$$gmdiff \approx gmn \quad (11)$$

In this manner, the mutual conductance of the differential pair of the operational amplifier is widely fluctuated depending on the input voltage. Further, by turning OFF either one of the differential pairs, current flowing through active loads AL101 (FIG. 15) and AL100 (FIG. 13) is changed, and a deterioration in a slew rate and a deterioration in a bandwidth of the operational amplifier are caused.

In Patent Literature 1, in order to restrain an influence on a circuit characteristic given by a fluctuation in an operation state of a differential pair caused by input voltage, a transistor is connected to a single end operational amplifier in parallel to ensure a current path in the case of turning OFF the differential pair. A configuration is proposed in which the transistor prevents current flowing through an active load from fluctuating against the input voltage which turns OFF the differential pair.

Further, in Patent Literature 2, a configuration is proposed in which a fluctuation in mutual conductance of all of differential pairs is restrained. In this configuration, a transistor in which extra current is flown is connected to differential pairs in parallel, and when either one of an NMOS differential pair and a PMOS differential pair is turned OFF, current of the differential pair which is turned ON is increased.

CITATION LIST

Patent Literature

Patent Literature 1: JP 2009-33230 A
Patent Literature 2: U.S. Pat. No. 5,734,297

Non-Patent Literature

Non-Patent Literature 1: "Transistor Technology 2011, 48(4), 559th", CQ Press, p. 89.
Non-Patent Literature 2: Paul R. Gray, et al., "Analysis And Design Of Analog Integrated Circuits Fourth Edition", WILEY, p. 848.

SUMMARY OF INVENTION

Technical Problem

According to the configuration of Patent Literature 1, although the current flowing through the active load upon the fluctuation in the input voltage is kept constant, the reduction in mutual conductance caused by turning OFF the differential pair cannot be complemented.

Further, according to the configuration of Patent Literature 2, in a state of turning OFF either one of the differential pairs, the fluctuation in the mutual conductance can be restrained. However, a problem arises that when all of the differential pairs are ON, a current consumption is increased only with respect to the current flowing through the extra transistor.

The present invention aims to realize, by employing a simple configuration, a restraint of a fluctuation in mutual conductance when input voltage is fluctuated, a restraint of a change in current flowing through an active load, and a restraint of increasing in the consumption of the current.

Solution to Problem

An operational amplifier circuit according to the present invention includes:
a first parallel unit including a first differential pair configured with two field effect transistors having a same channel that is either N-channel or P-channel and a second differential pair configured with two field effect transistors channels of which are different from those of the first differential pair and connected to the first differential pair in parallel;
a second parallel unit including a third differential pair configured with two field effect transistors channels of which are same as those of the first differential pair and a fourth differential pair configured with two field effect transistors channels of which are same as those of the second differential pair and connected to the third differential pair in parallel;
a first current source to supply bias current to the first differential pair and the third differential pair; and
a second current source to supply bias current to the second differential pair and the fourth differential pair.

Advantageous Effects of Invention

According to the present invention, without accompanying an increase in a current consumption of a circuit and an increase in a circuit scale, it can be attained that current flowing through an active load is kept constant, and also a fluctuation in mutual conductance is restrained.

DESCRIPTION OF EMBODIMENTS

In first to fourth embodiments below, an NMOS transistor N11 being an N-channel MOS transistor is described as the transistor N11. Also, a PMOS transistor P31 being a P-channel MOS transistor is described as the transistor P31. The same applies to other NMOS transistors and PMOS transistors.

First Embodiment

Figure 1:
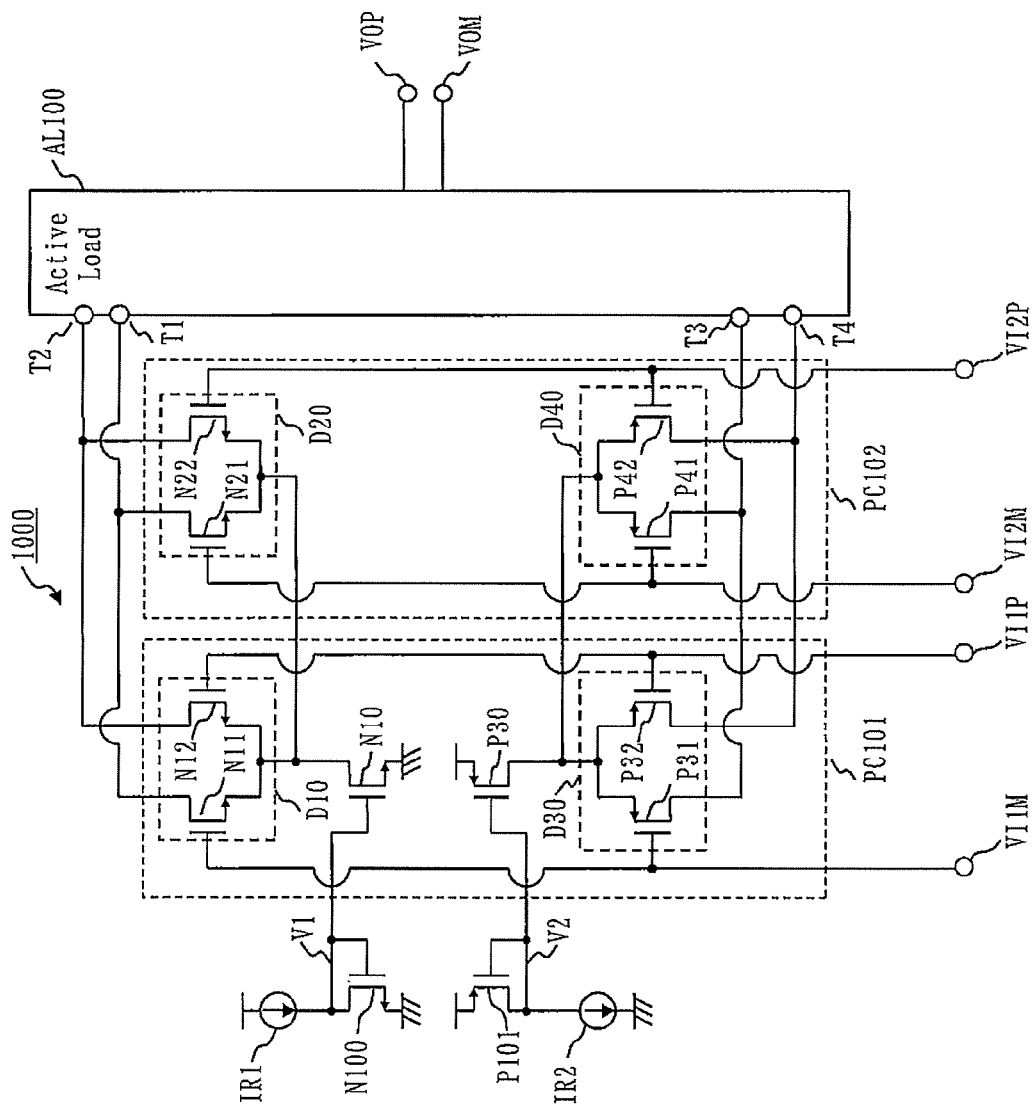
FIG. 1 is a diagram of a first embodiment and is a schematic diagram of a circuit of an operational amplifier circuit 1000.

FIG. 1 is a circuit diagram of an operational amplifier circuit 1000 configuring a differential amplifier circuit.

Figure 2:
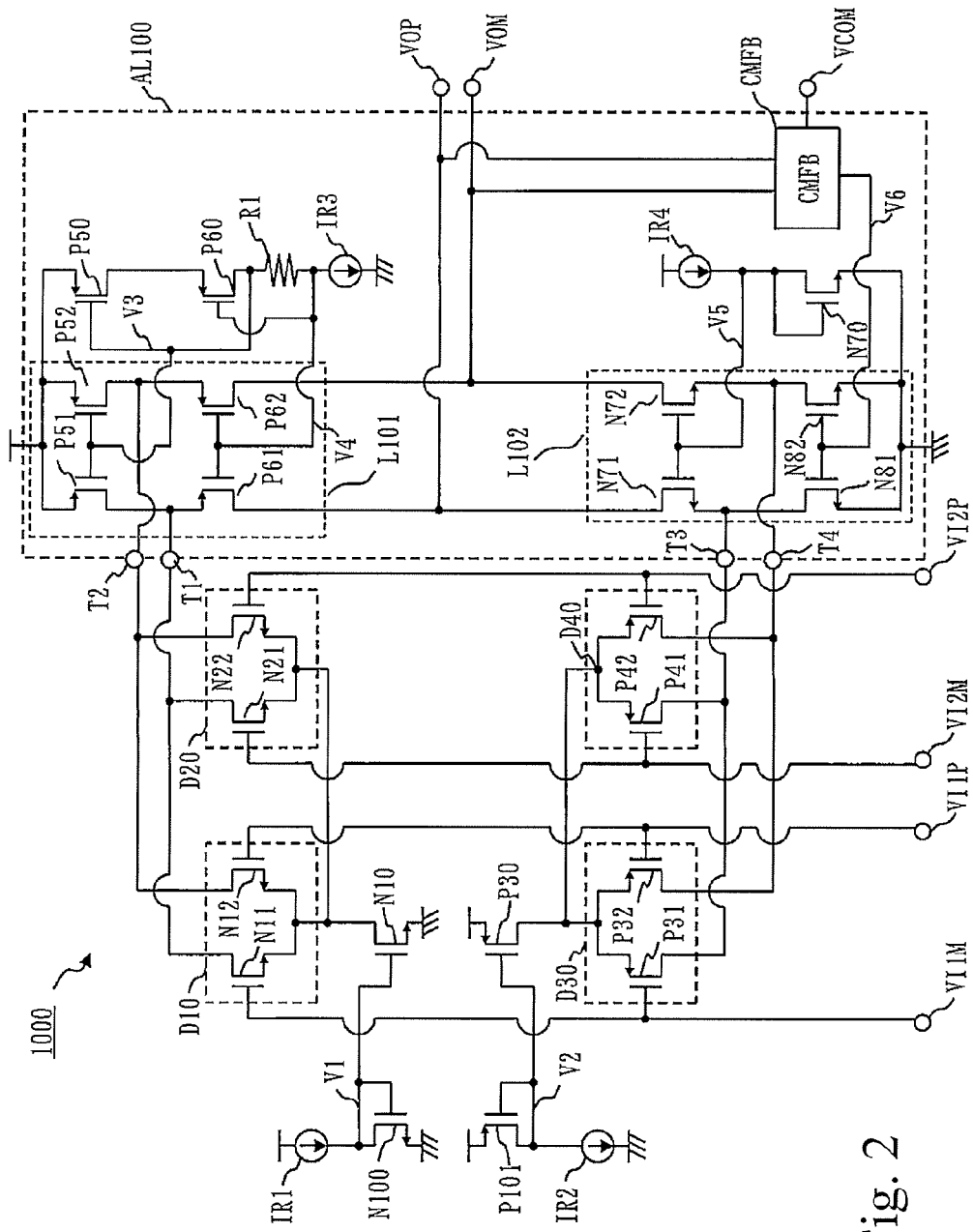
FIG. 2 is a diagram of the first embodiment and is a circuit diagram illustrating a specific example of the operational amplifier circuit 1000.

FIG. 2 is a circuit diagram illustrating a specific example of the operational amplifier circuit 1000. FIG. 2 is the diagram in which a circuit configuration of an active load AL100 of FIG. 1 is illustrated. As described below, the operational amplifier circuit 1000 can be applied to differential amplifier circuits illustrated in FIGS. 10, 11, and 12. That is, the operational amplifier circuit 1000 may be incorporated into a double differential operational amplifier A100 illustrated using the symbol for the operational amplifier in FIGS. 10, 11, and 12.

(Configuration of Operational Amplifier Circuit 1000)

The operational amplifier circuit 1000 includes a differential pair D10 (a first differential pair), a differential pair D20 (a third differential pair), a differential pair D30 (a second differential pair), and a differential pair D40 (a fourth differential pair). The differential pairs D10, D20, D30, and D40 are connected similarly to the case of FIG. 13 where the differential pair D10 is in parallel with the differential pair D30, and the differential pair D20 is in parallel with the differential pair D40. A first parallel unit PC101 is configured with the differential pair D10 and the differential pair D30, and a second parallel unit PC102 is configured with the differential pair D20 and the differential pair D40.

(Configurations of Differential Pairs)
(1) The differential pair D10 is configured with transistors N11, and N12. Gate terminals of the transistors N11 and N12 are respectively connected to a first inverting input terminal VI1M disposed as an inverting input terminal and a first non-inverting input terminal VI1P disposed as a non-inverting input terminal.
(2) The differential pair D20 is configured with transistors N21, and N22. Gate terminals of the transistors N21 and N22 are respectively connected to a second inverting input terminal VI2M disposed as an inverting input terminal and a second non-inverting input terminal VI2P disposed as a non-inverting input terminal.
(3) The differential pair D30 is configured with transistors P31, and P32. Gate terminals of the transistors P31 and P32 are respectively connected to the first inverting input terminal VI1M disposed as the inverting input terminal and the first non-inverting input terminal VI1P disposed as the non-inverting input terminal.
(4) The differential pair D40 is configured with transistors P41, and P42. Gate terminals of the transistors P41 and P42 are respectively connected to the second inverting input terminal VI2M disposed as the inverting input terminal and the second non-inverting input terminal VI2P disposed as the non-inverting input terminal.

(Supply of Bias Current)

The differential pairs D10 and D20 are supplied with bias current from a transistor N10 (a first current source). As in FIG. 1, source terminals of the transistor N11 and the transistor N12 are connected to each other. Source terminals of the transistor N21 and the transistor N22 are also connected to each other. Source terminals of the differential pair D10 and the differential pair D20 are short-circuited to each other. The transistor N10 being the current source supplies the bias current from a drain to the short-circuited source terminals of the differential pair D10 and the differential pair D20.

(Current Source of Bias Current)

Transistors N10 and N100 are NMOS transistors configuring a current mirror for the bias current of the NMOS differential pairs D10 and D20. A current source IR1 is connected to a drain of the transistor N100. A source of the transistor N100 is grounded. A connection path to connect the drain and a gate of the transistor N100 is formed, and a point on this connection path and a gate of the transistor N10 are connected. A source of the transistor N10 is grounded.

(Connection of Differential Pair and Active Load)

In the differential pairs D10 and D20, drains of the transistors N11 and N21 are short-circuited, and these drains are connected to a first input terminal T1 of the active load AL100. Further, in the differential pairs D10 and D20, drains of the transistors N12 and N22 are short-circuited, and these drains are connected to a second input terminal T2 of the active load AL100.

(Supply of Bias Current)

The differential pairs D30 and D40 are supplied with bias current from a transistor P30 (a second current source). As in FIG. 1, source terminals of the transistor P31 and the transistor P32 are connected to each other. Source terminals of the transistor P41 and the transistor P42 are also connected to each other. Source terminals of the differential pair D30 and the differential pair D40 are short-circuited to each other. The transistor P30 being the current source supplies the bias current from a drain to the short-circuited source terminals of the differential pair D30 and the differential pair D40.

(Current Source of Bias Current)

Transistors P30 and P101 are PMOS transistors configuring a current mirror for the bias current of the PMOS differential pairs D30 and D40. A current source IR2 is connected to a drain of the transistor P101. A connection path to connect the drain and a gate of the transistor P101 is formed, and a point on this connection path and a gate of the transistor P30 are connected.

(Connection of Differential Pair and Active Load)

Further, in the transistors P31 and P41, drains are short-circuited, and these drains are connected to a third input terminal T3 of the active load AL100. Furthermore, in the transistor P32 and P42, drains are short-circuited, and these drains are connected to a fourth input terminal T4 of the active load AL100.

As in FIG. 1, the active load AL100 includes an inverting output terminal VOM and a non-inverting output terminal VOP. The active load AL100 outputs, depending on voltages input to each of the first inverting input terminal VI1M, the first non-inverting input terminal VI1P, the second inverting input terminal VI2M, and the second non-inverting input terminal VI2P, a differential output voltage VOUT which is expressed by the following equation:

$$VOUT = AP \cdot VP + AM \cdot VM \quad (12)$$

where $$VOUT = VOP - VOM \quad (13)$$

$$VP = VI1P - VI1M \quad (14)$$

$$VM = VI2P - VI2M \quad (15)$$

Further, mutual conductances of the differential pairs D10, D20, D30, and D40 are expressed as gm10, gm20, gm30, and gm40 and defined as below:

$$gmP = gm10 + gm30 \quad (16)$$

$$gmM = gm20 + gm40 \quad (17)$$

In this case, in the equation (12), voltage gains AP and AM are expressed as:

$$AP = gmP \cdot Zout \quad (18)$$

$$AM = gmM \cdot Zout \quad (19)$$

Note that, Zout of the equation (18) and the equation (19) is output impedance at a current to voltage conversion node of the active load AL100.

In the case of the operational amplifier circuit 1000 of FIG. 1, the bias current is supplied to the differential pairs D10 and D20 from the transistor N10 being the one current source, and the bias current is supplied to the differential pairs D30 and D40 from the transistor P30 being the other current source. According to this configuration, when voltage to turn OFF either one of the differential pairs D10 and D20, or either one of the differential pairs D30 and D40 is input from the first inverting input terminal VI1M or the like, the bias current flows into the other differential pair that is not turned OFF. For example, when the differential pair D10 is turned OFF from among the differential pairs D10 and D20, the bias current of the transistor N10 entirely flows into the differential pair D20 that is not turned OFF. Similarly, when the differential pair D30 is turned OFF from among the differential pairs D30 and D40, the bias current of the transistor P30 entirely flows into the differential pair D40 that is not turned OFF. Accordingly, when the differential pair D10 is turned OFF as in the above example, in the equation (16), $$gmP = gm10 + gm30$$

even if gm10=0, the bias current of the transistor N10 entirely flows into the differential pair D20.

Hence, in the equation (17), $$gmM = gm20 + gm40$$

gm20 increases.

Therefore, in the equation (12), $$VOUT = AP \cdot VP + AM \cdot VM$$

a fluctuation in VOUT can be restrained. Further, since the circuit current is kept constant, a fluctuation in a frequency characteristic can be restrained.

In FIG. 2, the active load AL100 is realized by using NMOS transistors and PMOS transistors. The active load AL100 adds signal currents obtained from respective differential pair and converts the added current into a voltage signal.

(Configuration of Active Load)

The active load AL100 is configured with cascode connected transistors P51, P52, P61, and P62, and cascode connected transistors N71, N72, N81, and N82. A first load unit L101 is configured with the cascode connected transistors P51, P52, P61, and P62. A second load unit L102 is configured with the cascode connected transistors N71, N72, N81, and N82. The transistors P51 and P52 and the transistors P61 and P62 are respectively supplied with gate voltages V3 and V4 from transistors P50 and P60, and a resistor R1 biased by a current source IR3. The transistors N71 and N72 are supplied with a gate voltage V5 from a transistor N70 biased by a current source IR4. The transistors N81 and N82 are supplied with a gate control voltage V6 from a common mode feedback circuit CMFB. The common mode feedback circuit CMFB monitors output common mode voltages of the output terminals VOP and VOM and outputs the gate control voltage V6 so that the output common mode voltage is equal to a predetermined input voltage VCOM.

Figure 10:
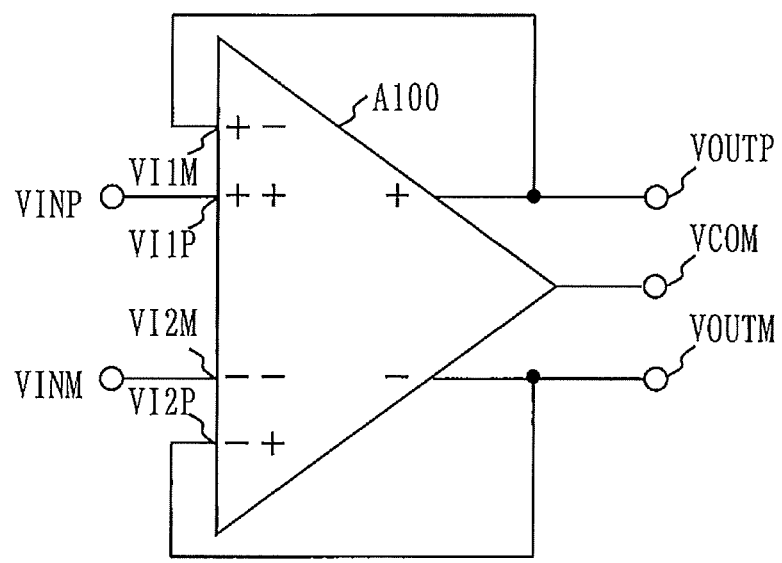
FIG. 10 is a circuit diagram illustrating the differential amplifier circuit using the symbol for the operational amplifier.

(Application to FIG. 10)

The operational amplifier circuit 1000 illustrated in FIGS. 1 and 2 can be applied to a differential amplifier circuit illustrated in FIG. 10.

Figure 3:
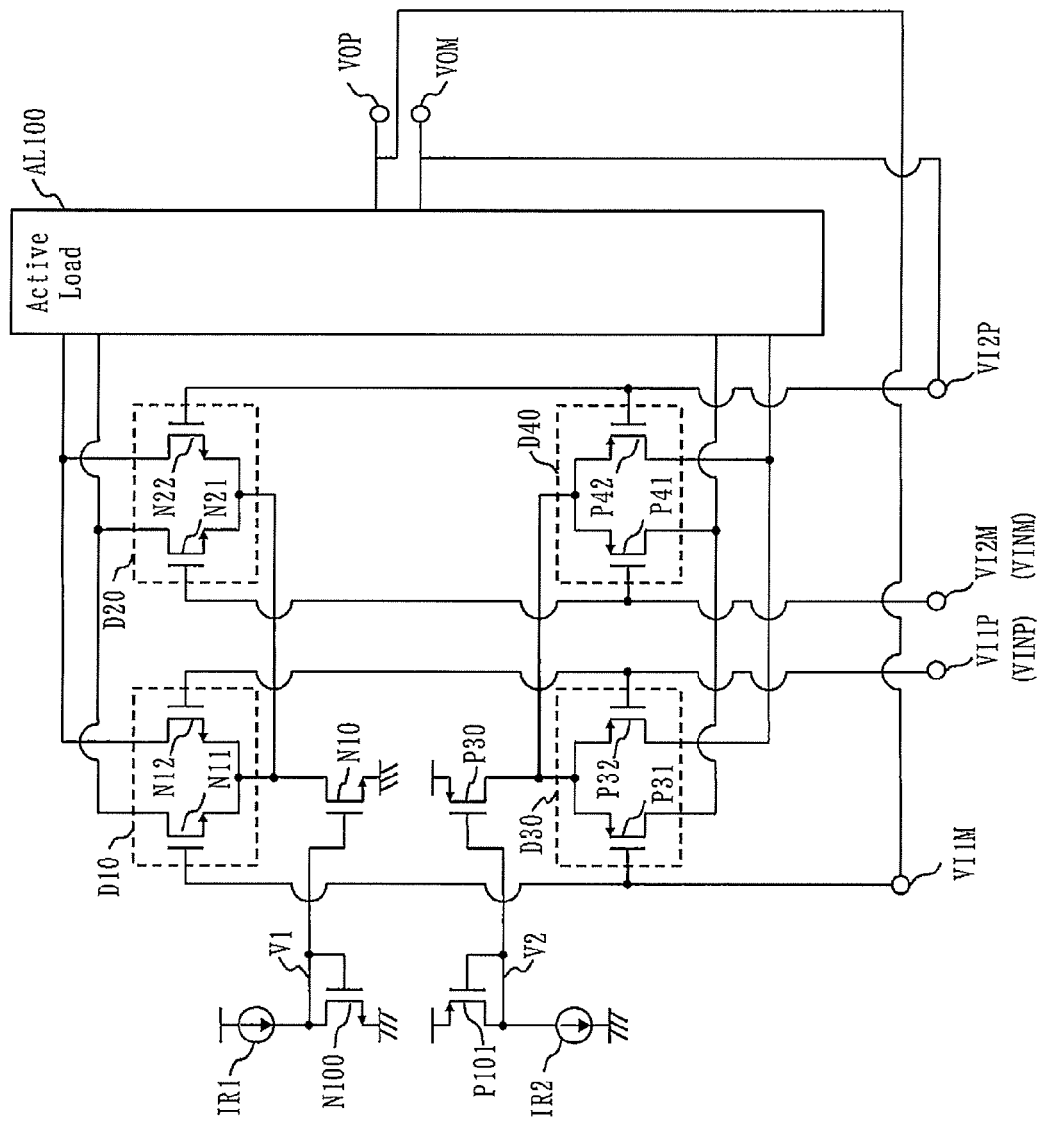
FIG. 3 is a diagram of the first embodiment and is a circuit diagram when the operational amplifier circuit 1000 is applied to a differential amplifier circuit of FIG. 10.

FIG. 3 is a circuit diagram as to the case where the operational amplifier circuit 1000 is applied to a differential amplifier circuit illustrated in FIG. 10. In the differential amplifier circuit illustrated in FIG. 3, a non-inverting input voltage VINP and an inverting input voltage VINM are input to the first non-inverting input terminal VI1P and the second inverting input terminal VI2M. The non-inverting output voltage VOP and the inverting output voltage VOM are respectively assigned as a non-inverting output VOUTP and an inverting output VOUTM of the differential amplifier circuit. Further, in the differential amplifier circuit, a difference between the non-inverting output voltage VOP and the inverting output voltage VOM is output as the differential output voltage VOUT. Furthermore, the non-inverting output voltage VOUTP (VOP in FIG. 2) is fed back to the first inverting input terminal VI1M, and the inverting output voltage VOUTM (VOM in FIG. 2) is fed back to the second non-inverting input terminal VI2P.

Figure 13:
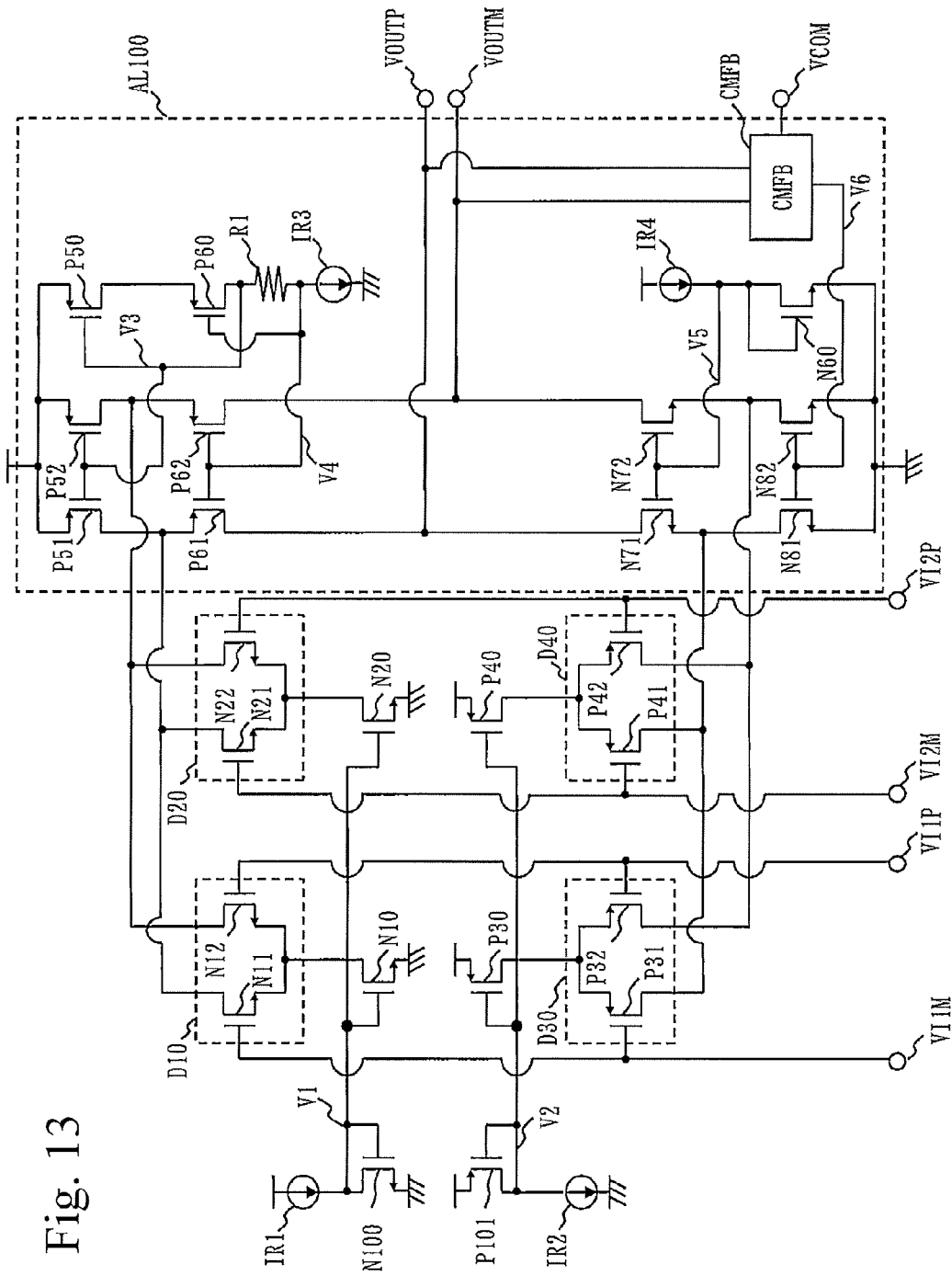
FIG. 13 is a diagram illustrating a conventional art and is a circuit diagram illustrating a double differential operational amplifier.

In the circuit of FIG. 3, the bias current is supplied to the differential pairs D10 and D20 from the transistor N10 being the one current source, and the bias current is supplied to the differential pairs D30 and D40 from the transistor P30 being the other current source. Conventionally, a circuit of FIG. 13 is incorporated into the differential amplifier circuit of FIG. 10. That is, in the conventional differential amplifier circuit of FIG. 10, as in FIG. 13, the bias current is supplied from respective current source of the transistors N10, N20, P30, and P40 to the differential pairs D10, D20, D30, and D40. In the case of this configuration, if the one input voltage should be at a power supply potential, and the other input voltage should be at a ground potential, from among two P-channel differential pairs and two N-channel differential pairs, only each one of the P-channel and N-channel differential pairs is operated. Accordingly, the current flowing through an output unit (the active load) is fluctuated by the input voltage. Due to the fluctuation, mutual conductance of the differential amplifier circuit is changed, and the frequency characteristic of the circuit is fluctuated. This phenomenon is remarkable in a fine CMOS with low supply voltage of about 1V.

In comparison with the conventional case, as in FIG. 3, the bias current is supplied to the differential pairs D10 and D20 from the one current source, and the bias current is supplied to the differential pairs D30 and D40 from the other current source. According to this configuration, as described above, when the input voltage VINP should be at the power supply potential and the input voltage VINM should be at the ground potential, and the differential pair D20 and the differential pair D30 are turned OFF in FIG. 3, the bias current supplied from the transistor N10 being the current source flows to an output stage via the differential pair D10, and the bias current supplied from the transistor P30 being the current source flows to the output stage via the differential pair D40. Therefore, when the differential pair D20 and the differential pair D30 are turned OFF, the circuit current is kept constant, and the fluctuation in the frequency characteristics can be restrained.

In the present configuration, it is assumed that the voltage gains AP and AM are sufficiently large in the equation (12).

In this case, each of VI1P, VI1M and VI2P, VI2M is virtually short circuited and should be at the same potential.

The output voltage can be obtained by the following:

$$VOUT=VOUTP-VOUTM=VINP-VINM \quad (20)$$

That is, the differential amplifier circuit of FIG. 3 applying the operational amplifier circuit 1000 operates as a voltage buffer for a differential signal. FIG. 10 illustrates a case of a voltage follower.

Figure 11:
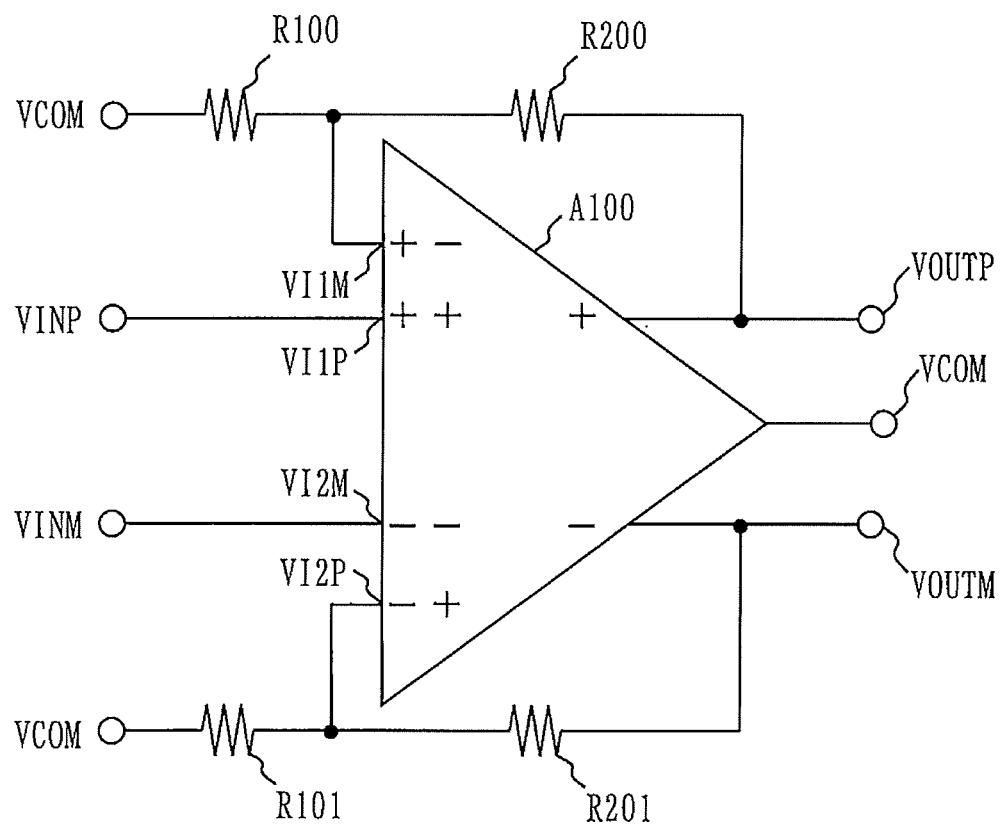
FIG. 11 is a circuit diagram illustrating another example of the differential amplifier circuit using the symbol for the operational amplifier.

(Application to FIG. 11)

Further, the operational amplifier circuit 1000 of FIG. 1 may be applied to the differential amplifier circuit of FIG. 11. FIG. 11 is a non-inverting differential amplifier circuit using a resistor network. According to the configuration of FIG. 11, it is possible to amplify a signal.

As in FIG. 11, a non-inverting signal and an inverting signal are respectively input as differential signals from the first non-inverting input terminal VI1P (VINP) and the second inverting input terminal VI2M (VINM). A difference between the voltage at the non-inverting output terminal (VOP) and the voltage at the inverting output terminal (VOM) of the operational amplifier circuit 1000 is extracted as the differential output signal. An output of the inverting output terminal VOM (VOUTM) is fed back to the second non-inverting input terminal VI2P, and an output of the non-inverting output terminal VOP (VOUTP) is fed back to the first inverting input terminal VI1M. A resistor R200 (a first resistance element) is located on a path which feeds back from the non-inverting output terminal VOP to the first inverting input terminal VI1M. A resistor R201 (a second resistance element) is located on a path which feeds back from the inverting output terminal VOM to the second non-inverting input terminal VI2P. A resistor R100 is located on a path which is from a first common voltage terminal VCOM disposed as a common voltage terminal and connects between the resistor R200 and the first inverting input terminal VI1M. A resistor R101 (a fourth resistor element) is located on a path which is from a second common voltage terminal VCOM disposed as the common voltage terminal and connects between the resistor R201 and the second non-inverting input terminal VI2P.

Figure 12:
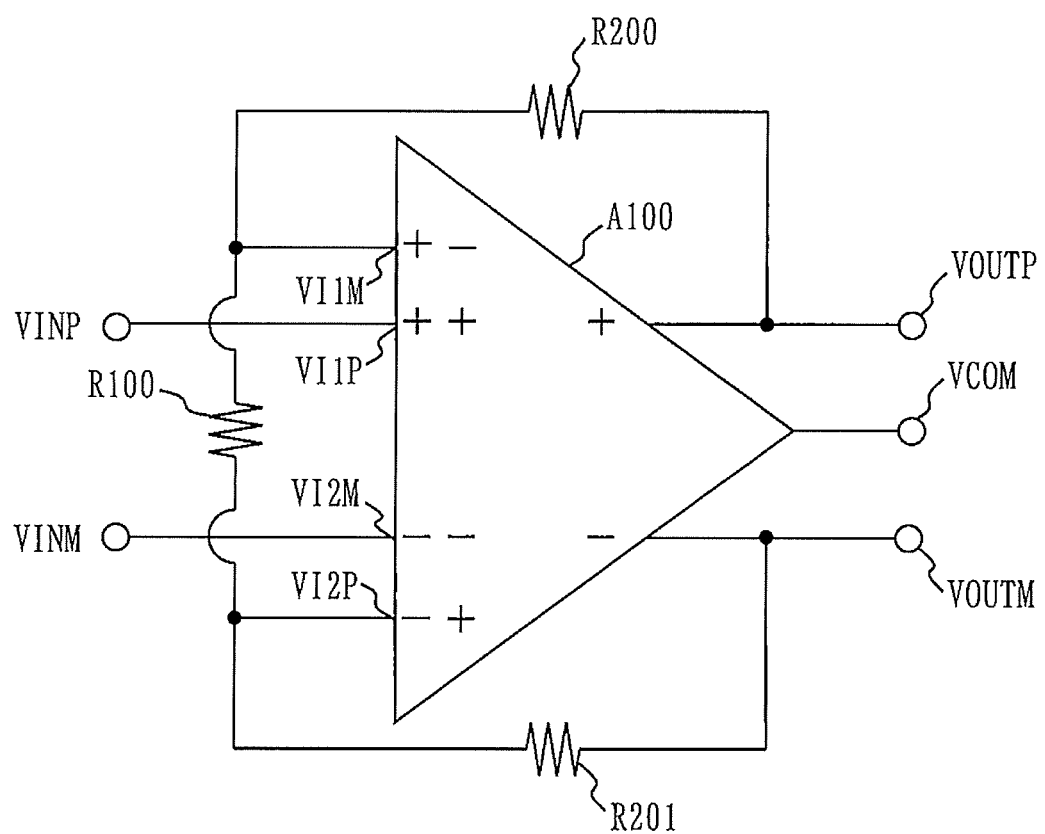
FIG. 12 is a circuit diagram illustrating yet another example of the differential amplifier circuit using the symbol for the operational amplifier.

(Application to FIG. 12)

Further, the operational amplifier circuit 1000 of FIG. 1 may be applied to the differential amplifier circuit 1000 illustrated in FIG. 12. It is assumed that the operational amplifier circuit of FIG. 1 is included in the operational amplifier A100 of FIG. 12.

In FIG. 12, a non-inverting signal and an inverting signal are respectively input as differential signals from the first non-inverting input terminal VI1P (VINP) and the second inverting input terminal VI2M (VINM). A difference between the voltage at the non-inverting output terminal (VOP) and the voltage at the inverting output terminal (VOM) of the operational amplifier circuit 1000 is extracted as the differential output signal. An output of the inverting output terminal VOM (VOUTM) is fed back to the second non-inverting input terminal VI2P, and an output of the non-inverting output terminal VOP (VOUTP) is fed back to the first inverting input terminal VI1M. The resistor R100 is located on a path which connects the first inverting input terminal VI1M and the second non-inverting input terminal VI2P. The resistor R200 is located on a path which feeds back from the non-inverting output terminal VOP to the first inverting input terminal VI1M. The resistor R201 is located on a path which feeds back from the inverting output terminal VOM to the second non-inverting input terminal VI2P.

In the differential amplifier circuit (an instrumentation amplifier) illustrated in FIG. 12, if $$R200=R201 \quad (21)$$

a gain G in the equation (2) is expressed as:

$$G=(R100+2 \cdot R200)/R100 \quad (22)$$

Therefore, it is possible to configure the amplifier circuit with more simplified configuration without using the common voltage VCOM.

The operational amplifier circuit 1000 of the first embodiment, as in FIG. 2, the gate control voltage V6 of the common mode feedback circuit CMFB is provided to gate voltages of the transistors N81 and N82. However, a configuration may be employed in which the gate control voltage V6 is provided not only to the transistors N81 and N82, but also to any of the transistors P51 and P52, the transistor N10, and the transistor P30 or some of them.

Further, for the transistors P61 and P62, and the transistors N71 and N72, a gain boosted cascode configuration may be employed in which source potentials are monitored, and gate voltages are controlled so as to keep the source potential constant. Further, the transistors N10 and P30 being the current sources may be cascode connected.

According to the operational amplifier circuit 1000 of the first embodiment, the bias current is supplied to the differential pairs D10 and D20 from the one current source and to the differential pairs D30 and D40 from the other current source. Therefore, the current flowing through the active load is kept constant, and the fluctuation in the mutual conductance can be restrained.

Second Embodiment

Figure 4:
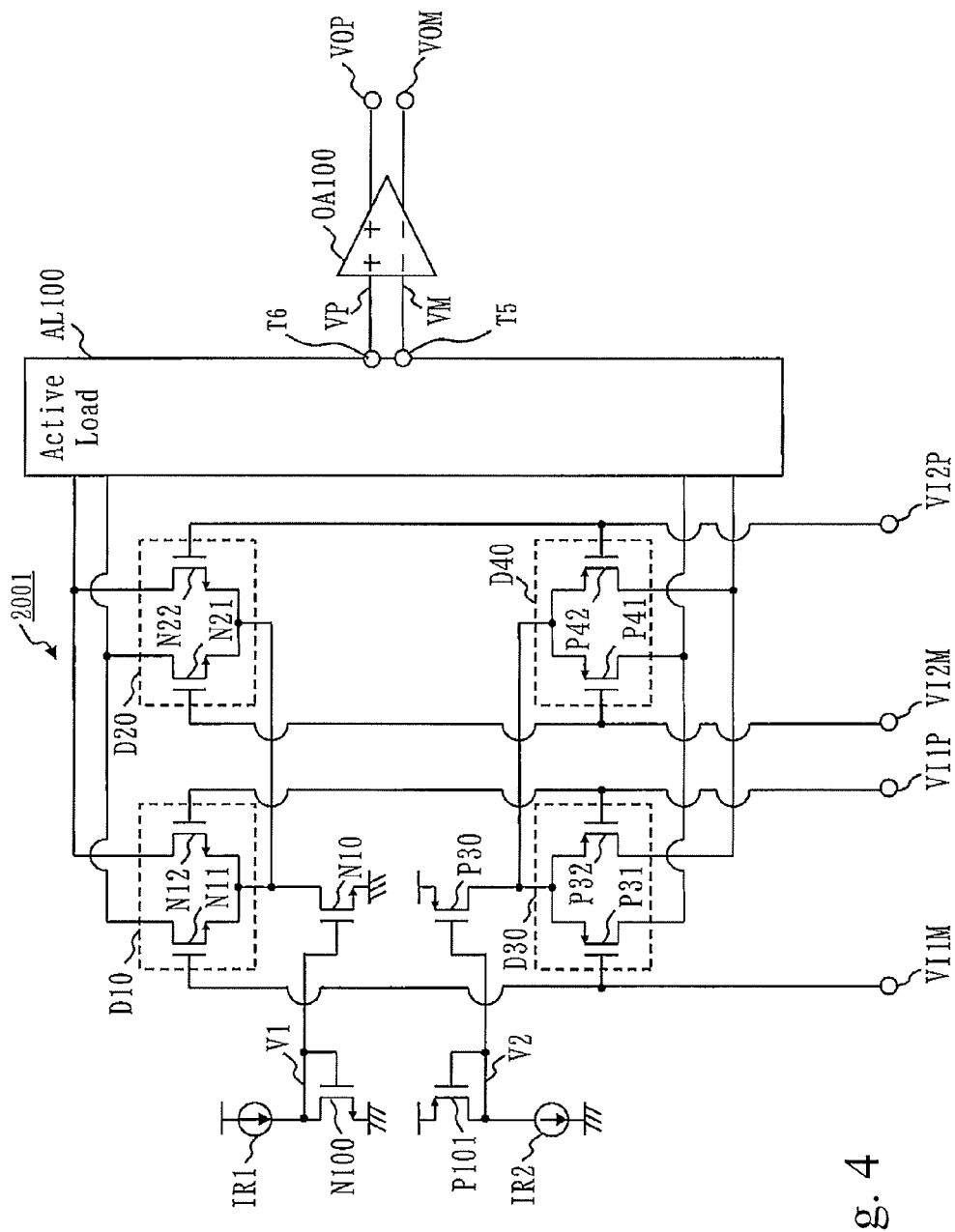
FIG. 4 is a diagram of a second embodiment and is a schematic diagram of a circuit of a differential amplifier circuit 2001.
Figure 5:
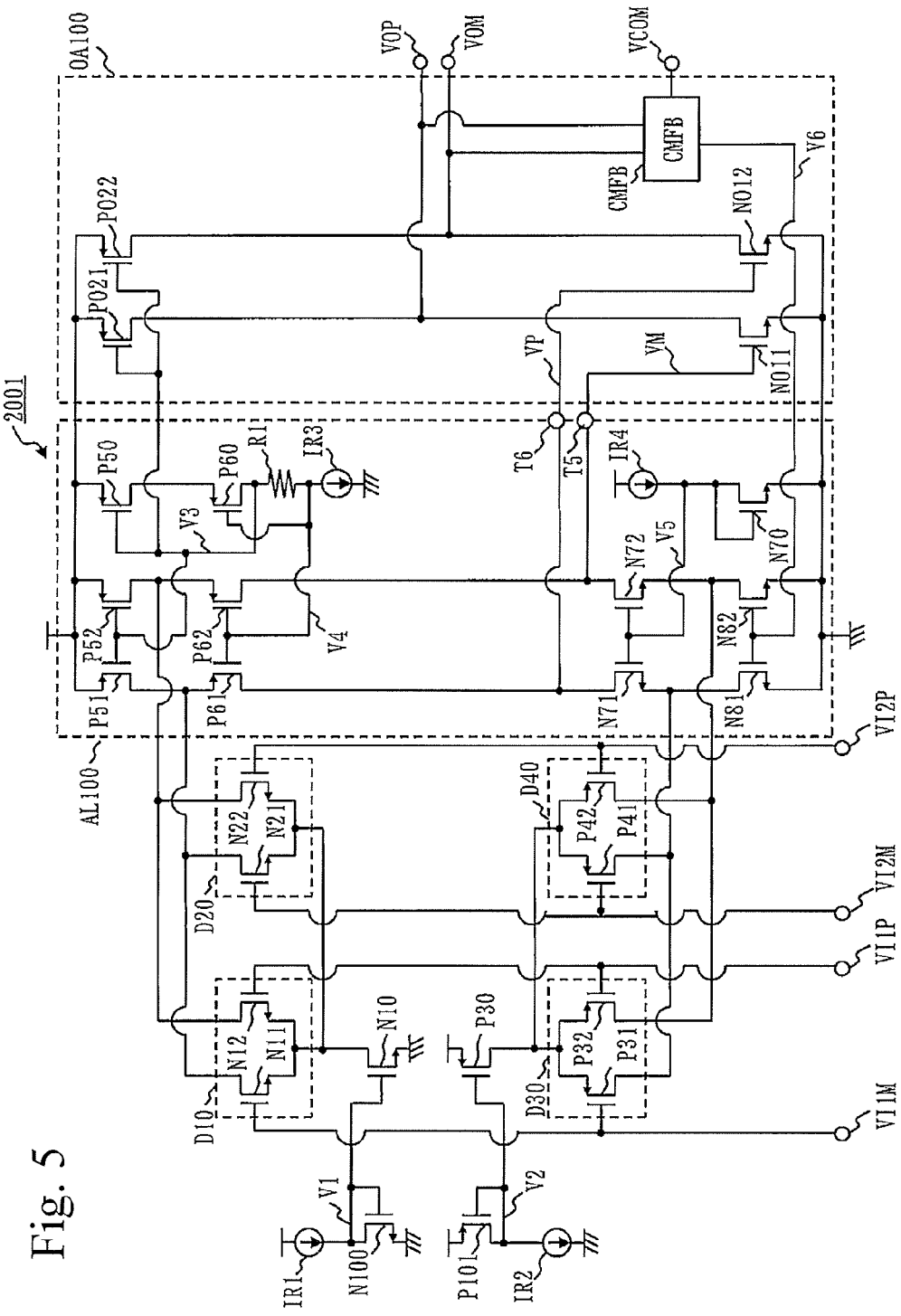
FIG. 5 is a diagram of the second embodiment and is a circuit diagram illustrating a specific example of the differential amplifier circuit 2001.

With reference to FIGS. 4 and 5, a second embodiment will be described.

FIG. 4 is a schematic diagram illustrating a differential amplifier circuit 2001 (an operational amplifier circuit) of the second embodiment.

FIG. 5 is a circuit diagram illustrating a specific example of the differential amplifier circuit 2001 of the second embodiment.

FIG. 5 is the diagram illustrating circuit configurations of the active load AL100 and an output amplifier OA100 of FIG. 4.

Here, only a difference from the first embodiment will be focused and described.

The differential amplifier circuit 2001 of the second embodiment is configured to connect a voltage amplifier circuit (the output amplifier OA100) to the output unit of the active load AL100 of the operational amplifier circuit 1000 of the first embodiment.

FIG. 5 is configured to connect the output amplifier OA100 being the voltage amplifier circuit to the circuit configuration of the operational amplifier circuit 1000 of FIG. 2. As in FIG. 5, an inverting output terminal T5 (an output voltage VM) and a non-inverting output terminal T6 (an output voltage VP) of the active load AL100 are respectively connected to the inverting output terminal and the non-inverting output terminal of the output amplifier OA100.

In the specific example of FIG. 5, the output amplifier OA100 is configured with transistors NO11, NO12, PO21, and PO22. The output amplifier OA100 includes the transistor NO11 that carries out amplification when receiving the output voltage VM of the active load AL100 at a gate, and the transistor NO12 that carries out amplification when receiving the output voltage VP at a gate. Further, the output amplifier OA100 includes transistors PO21 and PO22 that supplies bias current to transistors NO11 and NO12 when receiving a predetermined voltage at gates. The output amplifier OA100 is a source grounded amplifier circuit.

According to the configuration of FIG. 5 in which the output amplifier OA100 is connected, a gain of the differential amplifier circuit 2001 is improved, and an amplification operation with higher accuracy is enabled. Further, in the configuration of FIG. 5, as described in the first embodiment, a fluctuation in mutual conductance of a differential pair caused by input voltage is restrained so that a capacity value to be used for a phase compensation network can be set smaller than a conventional case. Therefore, a decrease in a bandwidth caused by the phase compensation is restrained, and the bandwidth can be widened.

Note that, in FIG. 5, the output amplifier OA100 employs a configuration of a class A amplifier circuit of the transistors NO11 and NO12 biased by the current mirror connected transistors PO21 and PO22. This configuration is one example. As a configuration of the output amplifier OA100, a configuration of the class A amplifier circuit of PMOS transistor may be employed, and it is obvious that it can also be a class AB amplifier circuit. Further, in FIG. 5, the output amplifier OA100 is a single-stage amplifier circuit. However, it can also be a multistage amplifier.

Third Embodiment

Figure 6:
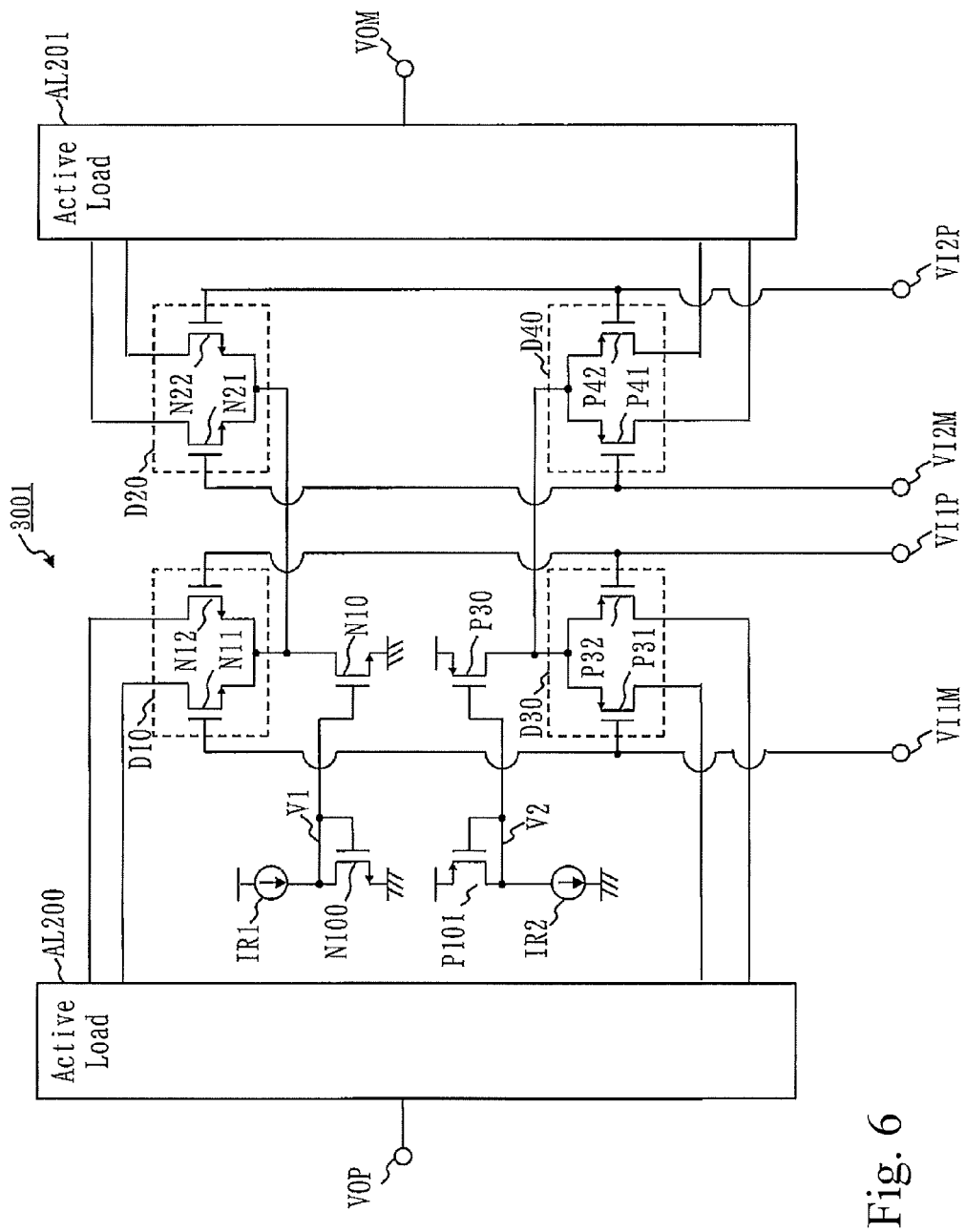
FIG. 6 is a diagram of a third embodiment and is a schematic diagram of a circuit of a differential amplifier circuit 3001.
Figure 7:
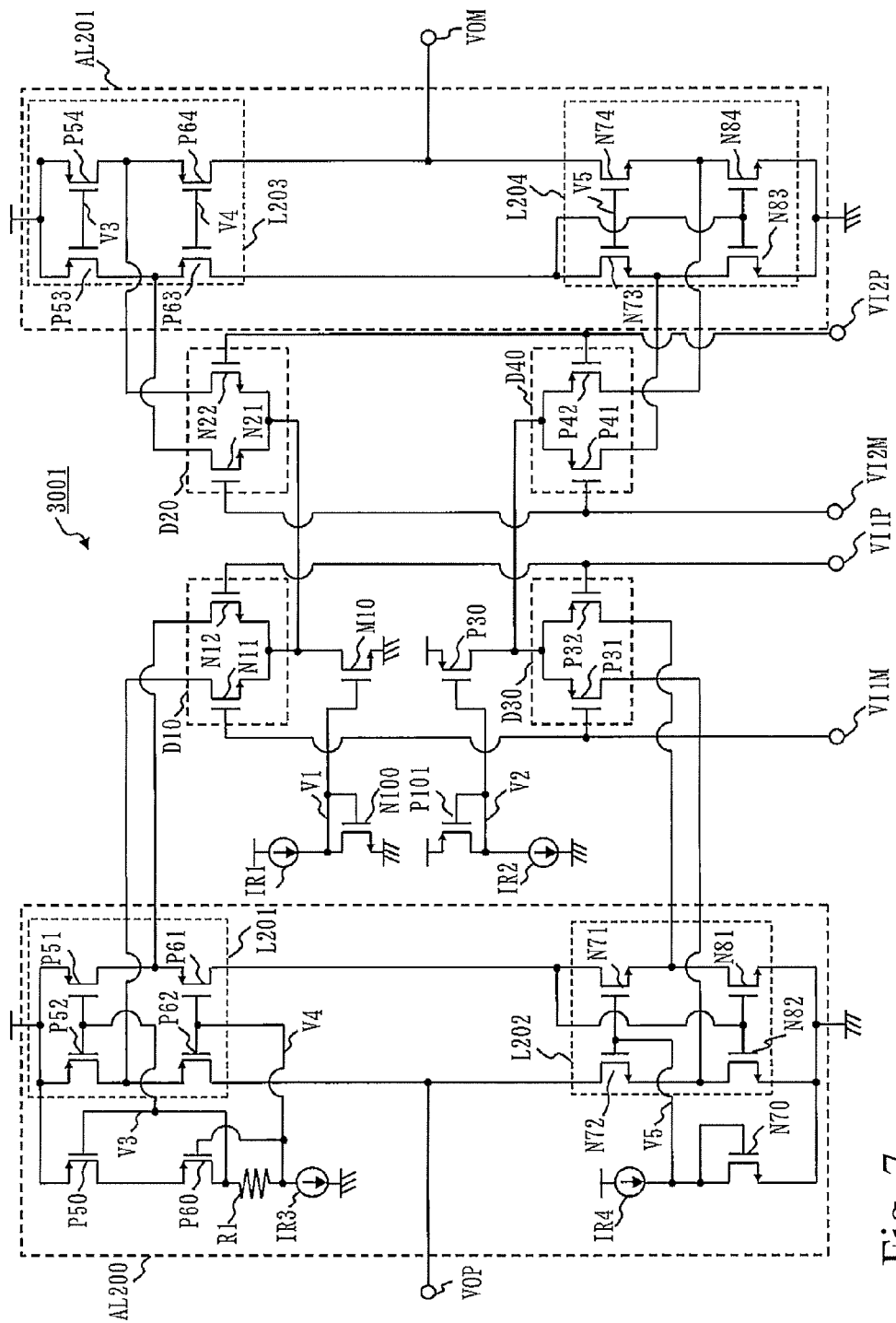
FIG. 7 is a diagram of the third embodiment and is a circuit diagram illustrating a specific example of the differential amplifier circuit 3001.

With reference to FIGS. 6 and 7, a third embodiment will be described.

FIG. 6 is a schematic diagram of a differential amplifier circuit 3001 (an operational amplifier circuit) of FIG. 6.

FIG. 7 illustrates a specific example of a circuit of the differential amplifier circuit 3001 of the third embodiment. FIG. 7 is a diagram illustrating circuit configurations of active loads AL200 and AL201 of FIG. 6. In the third embodiment, only a difference from the first embodiment will be focused and described.

The third embodiment employs, compared with the first embodiment, a configuration in which an active load AL100 of the first embodiment is served as an active load AL200 (a first active load) for an inverting output and as an active load AL201 (a second active load) for a non-inverting output separately. The active load AL200 adds signal currents obtained from the differential pairs D10 and D30 and converts a voltage signal to the added signal current. The active load AL201 adds signal currents obtained from the differential pairs D20 and D40 and converts a voltage signal to the added signal current.

As in FIG. 7, in a first parallel unit PC101, drains of the transistors N11, N12, P31, and P32 of the differential pairs D10 and D30 are connected to the active load AL200. In a second parallel unit PC102, drains of the transistors N21, N22, P41, and P42 of the differential pairs D20 and D40 are connected to the active load AL201.

As in FIG. 7, the active load AL200 is configured with cascode connected transistors P51, P52, P61, and P62 and cascode connected transistors N71, N72, M81, and N82. The active load AL201 is configured with cascode connected transistors P53, P54, P63, and P64 and cascode connected transistors N73, N74, N83, and N84. The active load AL200 includes a first connection unit L201 and a second connection unit L202. The active load AL201 includes a third connection unit L203 and a fourth connection unit L204. The first connection unit L201 is connected to the drains of the transistors N11 and N12 of the differential pair D10, and the second connection unit L202 is connected to the drains of the transistors P31 and P32 of the differential pair D30. The third connection unit L203 is connected to the drains of the transistors N21 and N22 of the differential pair D20, and the fourth connection unit L204 is connected to the drains of the transistors P41 and P42 of the differential pair D40.

The third embodiment employs a configuration of two single end operational amplifiers current sources of the differential pairs D10 and D20 and the differential pairs D30 and D40 of which are only in common.

Figure 14:
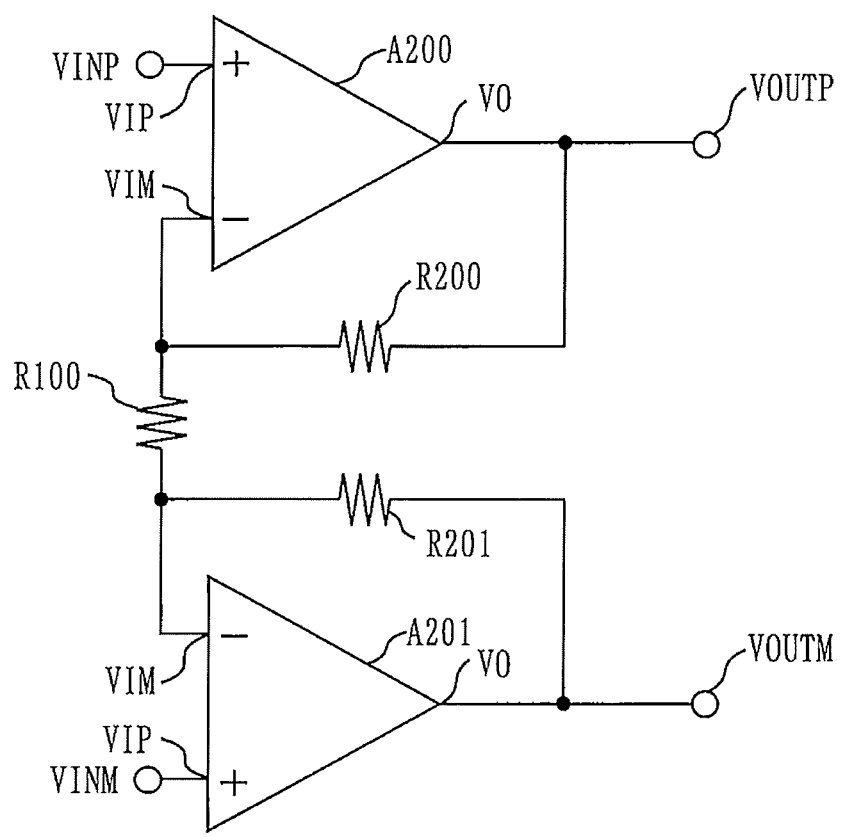
FIG. 14 is a diagram illustrating the conventional art and is a circuit diagram representing an example of a conventional instrumentation amplifier.
Figure 15:
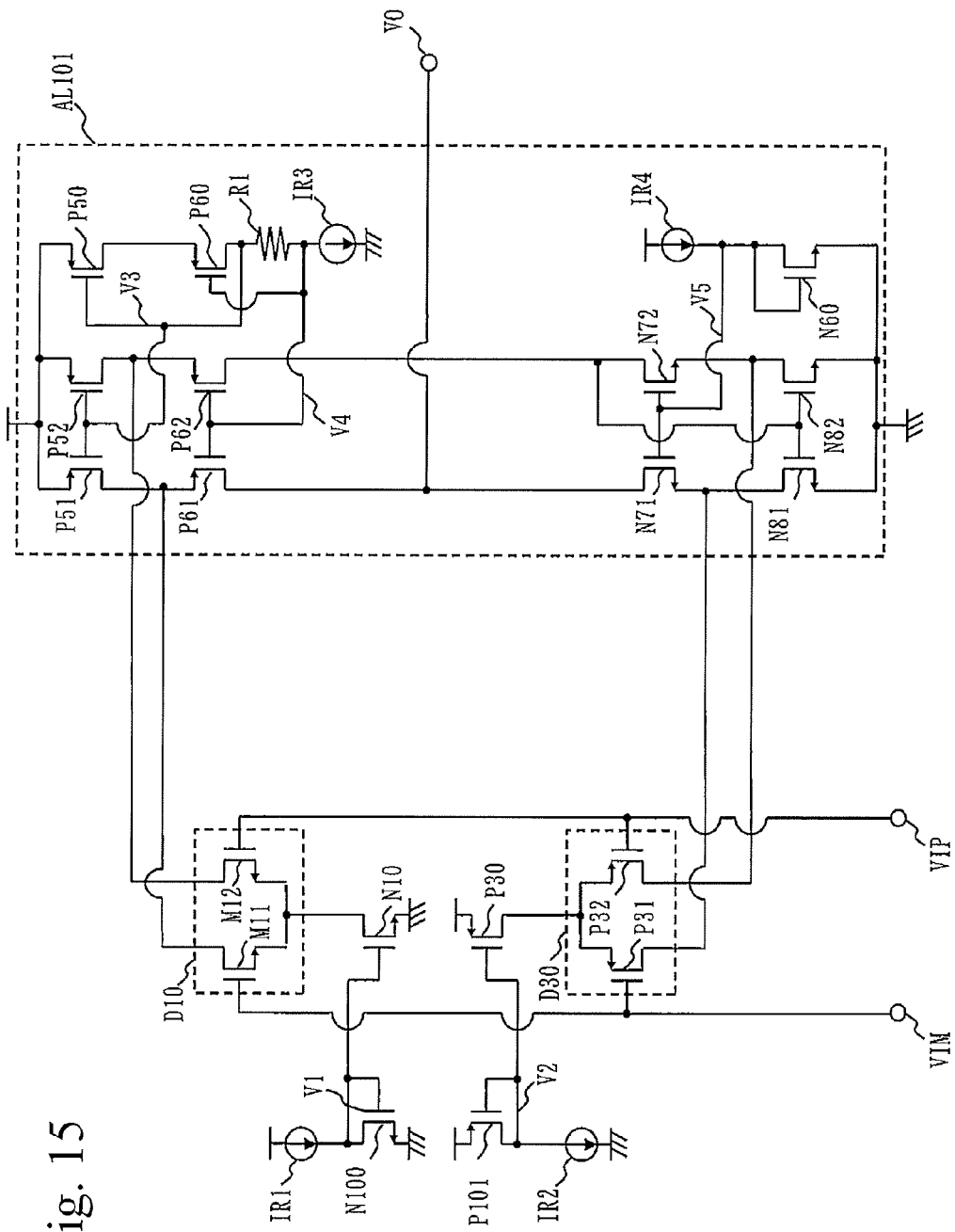
FIG. 15 is a diagram illustrating the conventional art and is a circuit diagram representing a specific example of an operational amplifier for configuring the conventional instrumentation amplifier.

According to configurations of FIGS. 6 and 7, in a configuration of a conventional instrumentation amplifier of FIG. 14, it is possible to restrain a fluctuation in mutual conductance of an operational amplifier caused by input voltage, and also it is possible to simplify a circuit design by eliminating the need for a common mode feedback circuit required for the first and second embodiments.

Fourth Embodiment

Figure 8:
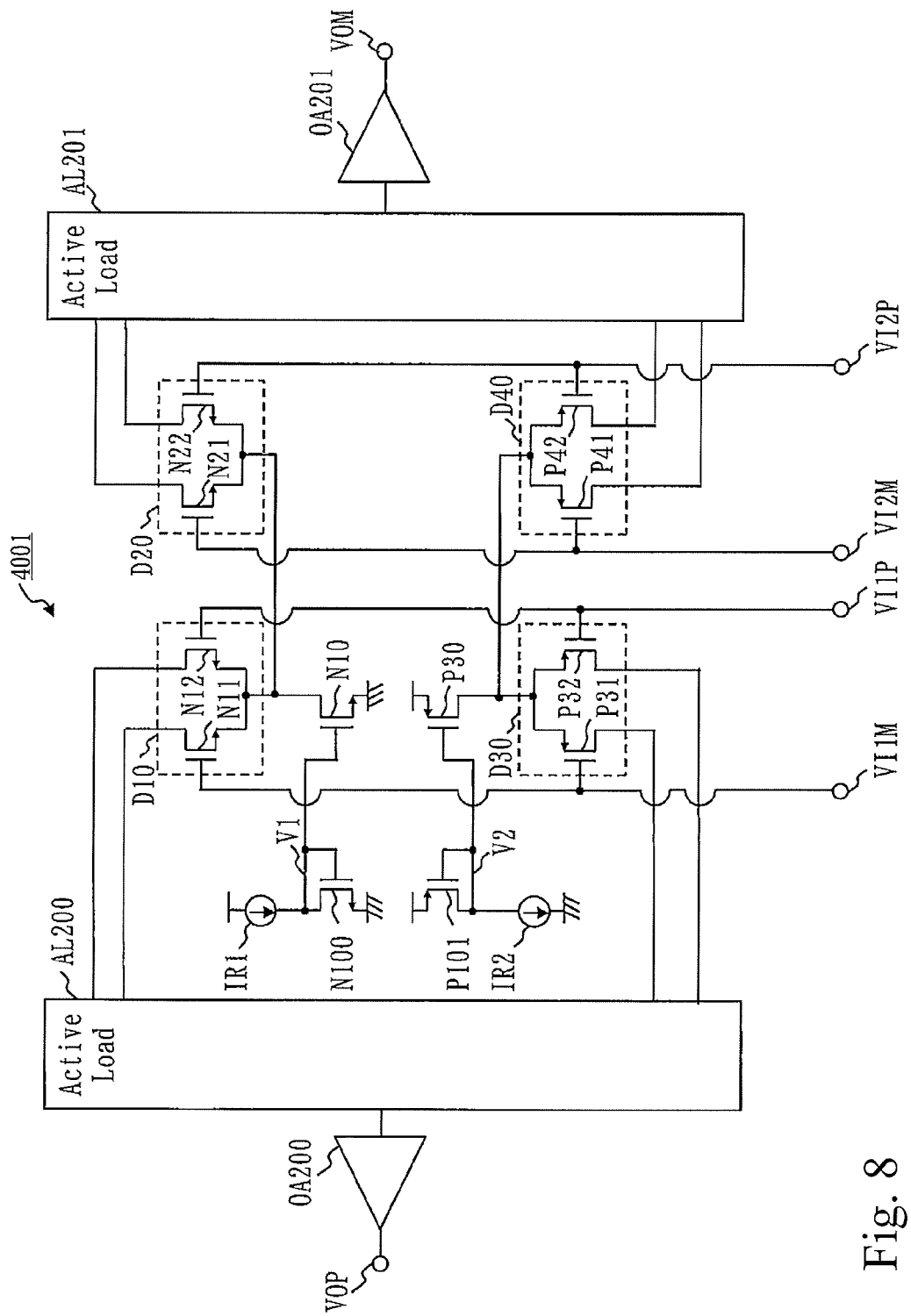
FIG. 8 is a diagram of a fourth embodiment and is a schematic diagram of a circuit of a differential amplifier circuit 4001.
Figure 9:
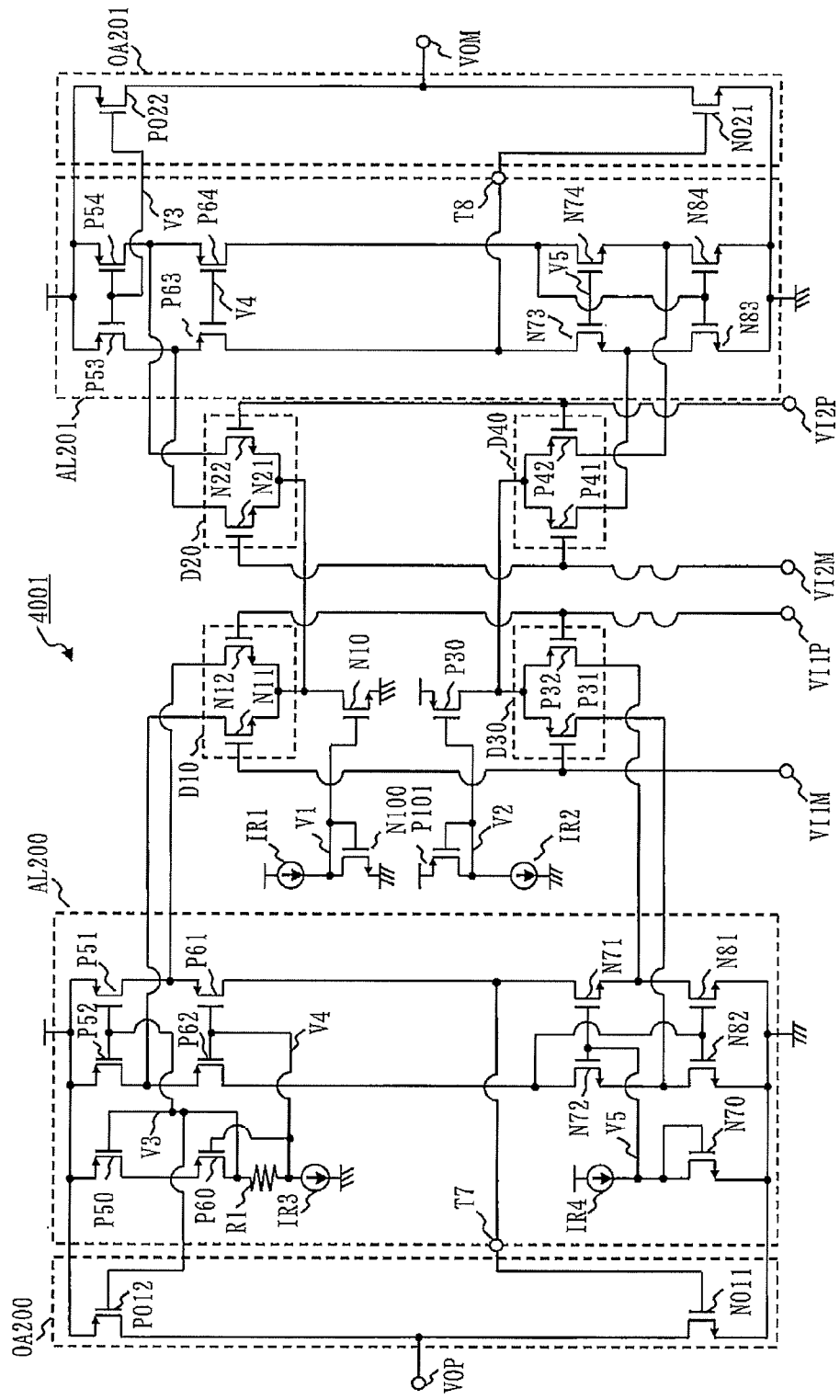
FIG. 9 is a diagram of the fourth embodiment and is a circuit diagram illustrating a specific example of the differential amplifier circuit 4001.

With reference to FIGS. 8 and 9, a fourth embodiment will be described.

FIG. 8 is a schematic diagram of a differential amplifier circuit 4001 (an operational amplifier circuit) of the fourth embodiment.

FIG. 9 illustrates a specific example of the differential amplifier circuit 4001 of the fourth embodiment. FIG. 9 is a diagram illustrating circuit configurations of the active loads AL200 and AL201, and output amplifiers OA200 and OA201 of FIG. 8. In the fourth embodiment, only a difference from the third embodiment will be focused and described.

In the fourth embodiment, output units of the active loads AL200 and AL201 described in the third embodiment are respectively connected to voltage amplifier circuits (the output amplifier OA200 and the output amplifier OA201). That is, the output amplifiers OA200 and OA201 are respectively located between the active load AL200 and the output terminal VOP and between the active load AL201 and the output terminal VOM.

In the specific example illustrated in FIG. 9, the output amplifier OA200 (a first voltage amplifier circuit) is configured with transistors NO11 and PO12, and the output amplifier OA201 (a second voltage amplifier circuit) is configured with transistors NO21 and PO22.

The output amplifier OA200 is connected to an output terminal T7 of the active load AL200, and the output amplifier OA201 is connected to an output terminal T8 of the active load AL201. The output amplifier OA200 amplifies voltage output from the output terminal T7, and the output amplifier OA201 amplifies voltage output from the output terminal T8.

The output amplifier OA200 is a source grounded amplifier circuit including the transistor NO11 that carries out amplification when receiving the output voltage of the output terminal T7 of the active load AL200 at a gate and the transistor PO12 that supplies bias current to the transistor NO11 when receiving a predetermined voltage at a gate. The output amplifier OA201 is a source grounded amplifier circuit including the transistor NO21 that carries out amplification when receiving the output voltage of the output terminal T8 of the active load AL201 at a gate and the transistor PO22 that supplies bias current to the transistor NO21 when receiving a predetermined voltage at a gate.

According to the configuration of FIG. 9, a gain of the differential amplifier circuit is improved, and an amplification operation with higher accuracy is enabled. Further, in the configuration of FIG. 9, as described in the first embodiment, a fluctuation in mutual conductance of a differential pair caused by input voltage is restrained so that a capacity value to be used for a phase compensation network can be set smaller than a conventional case. Therefore, a decrease in a bandwidth caused by the phase compensation is restrained, and the bandwidth can be widened.

Note that, in FIG. 9, the output amplifier OA200 and the output amplifier OA201 being the voltage amplifier circuits employ configurations of a class A amplifier circuit of the transistors NO11 and NO21 biased respectively by the current mirror connected transistors PO12 and PO22. This configuration is one example. The output amplifier OA200 and the output amplifier OA201 may employ configurations of a class A amplifier circuit of PMOS transistor, and it is obvious that it can also be a class AB amplifier circuit or the like. Further, in FIG. 9, the output amplifier circuit is a single-stage amplifier circuit. However, it can also be a multistage amplifier.

REFERENCE SIGNS LIST

1000: operational amplifier circuit; 2001, 3001, 4001: differential amplifier circuit; A100: double differential operational amplifier; A200, 201: single end operational amplifier; AL100, AL200, AL201: active load; CMFB: common mode feedback circuit; D10, D20: NMOS differential pair; D30, D40: PMOS differential pair; IR1 to 4: current source; L101: first load unit; L102: second load unit; L201: first connection unit; L202: second connection unit; L203: third connection unit; L204: fourth connection unit; N11, N12, N21, N22: NMOS transistor configuring NMOS differential pair; N100, N10, N20: NMOS transistor configuring current mirror for bias of NMOS differential pair; N71 to 74, N81 to N84: NMOS transistor configuring active load; N70: NMOS transistor configuring bias source of active load; NO11, NO21: NMOS transistor configuring output amplifier; OA100, OA200, OA201: output amplifier, P101, P30, P40: PMOS transistor configuring current mirror for bias of PMOS differential pair; P31, P32, P41, P42: PMOS transistor configuring PMOS differential pair; P51 to 54, P61 to 64: PMOS transistor configuring active load; P50, P60: PMOS transistor configuring bias source of active load; PO12, PO22: PMOS transistor configuring output amplifier; PC101: first parallel unit; PC102: second parallel unit; R100, R101, R200, R201: resistor configuring resistor network of operational amplifier circuit; R1: resistor configuring bias source of active load; T1, T2, T3, T4: input terminal; VINP, VINM: differential input terminal of differential amplifier circuit; VOUTP, VOUTM: differential output terminal of differential amplifier circuit; VI1P, VI1M: first differential input terminal of double differential operational amplifier; VI2P, VI2M: second differential input terminal of double differential operational amplifier; VOP, VOM: differential output terminal of double differential operational amplifier; VCOM: common mode voltage input terminal of double differential operational amplifier; VIP, VIM: differential input terminal of single end operational amplifier; and VO: output terminal of single end operational amplifier.

The invention claimed is:

1. An operational amplifier circuit comprising:
   a first parallel unit including a first differential pair configured with two field effect transistors having a same channel that is either N-channel or P-channel and a second differential pair configured with two field effect transistors channels of which are different from those of the first differential pair and connected to the first differential pair in parallel;
   a second parallel unit including a third differential pair configured with two field effect transistors channels of which are same as those of the first differential pair and a fourth differential pair configured with two field effect transistors channels of which are same as those of the second differential pair and connected to the third differential pair in parallel;
   a first current source to supply bias current to the first differential pair and the third differential pair;
   a second current source to supply bias current to the second differential pair and the fourth differential pair;
   an active load connected to the first parallel unit and the second parallel unit and in the first parallel unit and the second parallel unit,
      a drain of the one of the field effect transistors in the first differential pair and a drain of the one of the field effect transistors in the third differential pair are short-circuited and connected to the active load,
      a drain of the other one of the field effect transistors in the first differential pair and a drain of the other one of the field effect transistors in the third differential pair are short-circuited and connected to the active load,
      a drain of the one of the field effect transistors in the second differential pair and a drain of the one of the field effect transistors in the fourth differential pair are short-circuited and connected to the active load, and
      a drain of the other one of the field effect transistors in the second differential pair and a drain of the other one of the field effect transistors in the fourth differential pair are short-circuited and connected to the active load.

2. The operational amplifier circuit according to claim 1, wherein source terminals of the two field effect transistors in the first differential pair are short-circuited to each other,
   source terminals of the two field effect transistors in the third differential pair are short-circuited to each other,
   the first current source supplies the bias current to each of the short-circuited source terminals,
   source terminals of the two field effect transistors in the second differential pair are short-circuited to each other,
   source terminals of the two field effect transistors in the fourth differential pair are short-circuited to each other, and
   the second current source supplies the bias current to each of the short-circuited source terminals.

3. The operational amplifier circuit according to claim 1, wherein the first current source includes a transistor that supplies the bias current to the first differential pair and the third differential pair, and the second current source includes a transistor that supplies the bias current to the second differential pair and the fourth differential pair.

4. The operational amplifier circuit according to claim 1, wherein in the first parallel unit,
in each differential pair, a gate terminal of one of the field effect transistors configuring each differential pair is connected to a first inverting input terminal disposed as an inverting input terminal, and in each differential pair, a gate terminal of the other one of the field effect transistors configuring each differential pair is connected to a first non-inverting input terminal disposed as a non-inverting input terminal, and
in the second parallel unit,
in each differential pair, a gate terminal of one of the field effect transistors configuring each differential pair is connected to a second inverting input terminal disposed as an inverting input terminal, and in each differential pair, a gate terminal of the other one of the field effect transistors configuring each differential pair is connected to a second non-inverting input terminal disposed as a non-inverting input terminal.

5. The operational amplifier circuit according to claim 1, wherein the first differential pair and the third differential pair are configured with N-channel field effect transistors,
the second differential pair and the fourth differential pair are configured with P-channel filed effect transistors, and
the active load includes:
a first load unit having four cascode connected P-channel field effect transistors and connected to the first differential pair and the third differential pair; and
a second load unit having four cascode connected N-channel field effect transistors and connected the second differential pair and the fourth differential pair.

6. The operational amplifier circuit according to claim 1, further comprising a voltage amplifier circuit connected to output terminals of the active load.

7. The operational amplifier circuit according to claim 6, wherein the active load includes
an inverting output terminal outputting an inverting output voltage and a non-inverting output terminal outputting a non-inverting output voltage, and
the voltage amplifier circuit being a source grounded voltage amplifier circuit includes
a field effect transistor a gate terminal of which is applied with the inverting output voltage of the inverting output terminal and a source terminal of which is grounded and a field effect transistor a gate terminal of which is applied with the non-inverting output voltage of the non-inverting output terminal and a source terminal of which is grounded.

8. An operational amplifier circuit comprising:
a first parallel unit including a first differential pair configured with two field effect transistors having a same channel that is either N-channel or P-channel and a second differential pair configured with two field effect transistors channels of which are different from those of the first differential pair and connected to the first differential pair in parallel;
a second parallel unit including a third differential pair configured with two field effect transistors channels of which are same as those of the first differential pair and a fourth differential pair configured with two field effect transistors channels of which are same as those of the second differential pair and connected to the third differential pair in parallel;
a first current source to supply bias current to the first differential pair and the third differential pair;
a second current source to supply bias current to the second differential pair and the fourth differential pair;
a first active load connected to the first parallel unit;
a second active load connected to the second parallel unit, and
in the first parallel unit,
drains of the field effect transistors in the first differential pair and the second differential pair are connected to the first active load, and
in the second parallel unit,
drains of the field effect transistors in the third differential pair and the fourth differential pair are connected to the second active load.

9. The operational amplifier circuit according to claim 8, wherein the first active load includes:
a first connection unit having four cascode connected field effect transistors and connected to the drain of the one of the field effect transistors in the first differential pair and the drain of the other one of the field effect transistors in the first differential pair; and
a second connection unit having four cascode connected field effect transistors and connected to the drain of the one of the field effect transistors in the second differential pair and the drain of the other one of the field effect transistors in the second differential pair, and
the second active load includes:
a third connection unit having four cascode connected field effect transistors and connected to the drain of the one of the field effect transistors in the third differential pair and the drain of the other one of the field effect transistors in the third differential pair; and
a fourth connection unit having four cascode connected field effect transistors and connected to the drain of the one of the field effect transistors in the fourth differential pair and the drain of the other one of the field effect transistors in the fourth differential pair.

10. The operational amplifier circuit according to claim 8, further comprising:
a first voltage amplifier circuit connected to an output terminal of the first active load; and
a second voltage amplifier circuit connected to an output terminal of the second active load.

11. The operational amplifier circuit according to claim 10,
wherein the first voltage amplifier circuit being a source grounded voltage amplifier circuit includes
a field effect transistor a gate terminal of which is applied with voltage output from the output terminal of the first active load and a source terminal of which is grounded, and
the second voltage amplifier circuit being a source grounded voltage amplifier circuit includes
a field effect transistor a gate terminal of which is applied with voltage output from the output terminal of the second active load and a source terminal of which is grounded.

12. The operational amplifier circuit according to claim 4, wherein the active load
includes an inverting output terminal and a non-inverting output terminal,
feeds back an output of the inverting output terminal to the second non-inverting input terminal, and feeds back an output of the non-inverting output terminal to the first inverting input terminal.

13. The operational amplifier circuit according to claim 4, wherein the active load
includes an inverting output terminal and a non-inverting output terminal,
feeds back an output of the inverting output terminal to the second non-inverting input terminal, and
feeds back an output of the non-inverting output terminal to the first inverting input terminal, and
the operational amplifier circuit, further comprising:
a first resistance element located on a path which feeds back from the non-inverting output terminal to the first inverting input terminal;
a second resistance element located on a path which feeds back from the inverting output terminal to the second non-inverting input terminal;
a third resistance element located on a path which is from a first common voltage terminal disposed as a common voltage terminal and connects between the first resistance element and the first inverting input terminal; and
a fourth resistance element located on a path which is from a second common voltage terminal disposed as a common voltage terminal and connects between the second resistance element and the second non-inverting input terminal.

14. The operational amplifier circuit according to claim 4, wherein the active load
includes an inverting output terminal and a non-inverting output terminal,
feeds back an output of the inverting output terminal to the second non-inverting input terminal, and
feeds back an output of the non-inverting output terminal to the first inverting input terminal, and
the operational amplifier circuit, further comprising:
a resistance element located on a path which connects the first inverting input terminal and the second non-inverting input terminal;
a resistance element located on a path which feeds back from the non-inverting output terminal to the first inverting input terminal; and
a resistance element located on a path which feeds back from the inverting output terminal to the second non-inverting input terminal.

15. A bias current supply method comprising:
in a first parallel unit including a first differential pair configured with two field effect transistors having a same channel that is either N-channel or P-channel and a second differential pair configured with two field effect transistors channels of which are different from those of the first differential pair and connected to the first differential pair in parallel, and
in a second parallel unit including a third differential pair configured with two field effect transistors channels of which are same as those of the first differential pair and a fourth differential pair configured with two field effect transistors channels of which are same as those of the second differential pair and connected to the third differential pair in parallel, wherein an active load is connected to the first parallel unit and to the second parallel unit, and
in the first parallel unit and the second parallel unit,
  a drain of the one of the field effect transistors in the first differential pair and a drain of the one of the field effect transistors in the third differential pair are short-circuited and connected to the active load,
  a drain of the other one of the field effect transistors in the first differential pair and a drain of the other one of the field effect transistors in the third differential pair are short-circuited and connected to the active load,
  a drain of the one of the field effect transistors in the second differential pair and a drain of the one of the field effect transistors in the fourth differential pair are short-circuited and connected to the active load, and
  a drain of the other one of the field effect transistors in the second differential pair and a drain of the other one of the field effect transistors in the fourth differential pair are short-circuited and connected to the active load,
supplying bias current from a first current source to the first differential pair and the third differential pair; and
supplying bias current from a second current source to the second differential pair and the fourth differential pair.

16. The operational amplifier circuit according to claim 8, wherein
in the first parallel unit,
in each differential pair, a gate terminal of one of the field effect transistors configuring each differential pair is connected to a first inverting input terminal, and in each differential pair, a gate terminal of the other one of the field effect transistors configuring each differential pair is connected to a first non-inverting input terminal, and
in the second parallel unit,
in each differential pair, a gate terminal of one of the field effect transistors configuring each differential pair is connected to a second inverting input terminal, and in each differential pair, a gate terminal of the other one of the field effect transistors configuring each differential pair is connected to a second non-inverting input terminal.

* * * * *